(12) United States Patent
Henry et al.

(10) Patent No.: US 9,530,853 B2
(45) Date of Patent: Dec. 27, 2016

(54) SEMICONDUCTOR DEVICE WITH REDUCED LEAKAGE CURRENT AND METHOD FOR MAKING THE SAME

(71) Applicant: RF Micro Devices, Inc., Greensboro, NC (US)

(72) Inventors: Haldane S. Henry, Greensboro, NC (US); Eunki Hong, Oak Ridge, NC (US); Charles S. Whitman, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/627,340

(22) Filed: Feb. 20, 2015

(65) Prior Publication Data

US 2015/0255560 A1 Sep. 10, 2015

Related U.S. Application Data

(60) Provisional application No. 61/950,255, filed on Mar. 10, 2014.

(51) Int. Cl.
| | |
|---|---|
| H01L 21/44 | (2006.01) |
| H01L 29/47 | (2006.01) |
| H01L 29/812 | (2006.01) |
| H01L 29/66 | (2006.01) |
| H01L 21/285 | (2006.01) |

(Continued)

(52) U.S. Cl.
CPC ....... *H01L 29/475* (2013.01); *H01L 21/28581* (2013.01); *H01L 29/66863* (2013.01); *H01L 29/812* (2013.01); *H01L 21/02244* (2013.01); *H01L 21/02252* (2013.01); *H01L 21/02255* (2013.01); *H01L 29/2003* (2013.01)

(58) Field of Classification Search
None
See application file for complete search history.

(56) References Cited

U.S. PATENT DOCUMENTS

| | | | |
|---|---|---|---|
| 3,523,224 | A | 8/1970 | Gamari et al. |
| 4,582,564 | A | 4/1986 | Shanefield et al. |

(Continued)

OTHER PUBLICATIONS

Non-Final Office Action for U.S. Appl. No. 13/852,346, mailed Oct. 8, 2015, 7 pages.

(Continued)

*Primary Examiner* — Alexander Ghyka
(74) *Attorney, Agent, or Firm* — Withrow + Terranova, P.L.L.C.

(57) ABSTRACT

A semiconductor device with reduced leakage current and a method of making the same is disclosed. The semiconductor device includes a substrate having a device layer, a dielectric layer, and a gate metal opening within the dielectric layer between a source contact and a gate contact. A first metal layer is disposed within the gate metal opening, and a second metal layer is disposed directly onto the second metal layer, wherein the second metal layer is oxidized and has a thickness that ranges from about 4 Angstroms to about 20 Angstroms to limit a leakage current of a total gate periphery to between around 0.1 μA/mm and around 50 μA/mm. A current carrying layer is disposed on the second metal layer. In one embodiment, the first metal layer is nickel (Ni), the second metal layer is palladium (Pd), and the current carrying layer is gold (Au).

21 Claims, 3 Drawing Sheets

(51) Int. Cl.
    *H01L 29/20*         (2006.01)
    *H01L 21/02*         (2006.01)

(56) References Cited

U.S. PATENT DOCUMENTS

| | | |
|---|---|---|
| 5,597,738 A | 1/1997 | Kurtz et al. |
| 2004/0038466 A1 | 2/2004 | Yen et al. |
| 2007/0128736 A1 | 6/2007 | Chang et al. |
| 2007/0295993 A1 | 12/2007 | Chen et al. |
| 2009/0057720 A1* | 3/2009 | Kaneko .................. 257/194 |
| 2009/0108254 A1 | 4/2009 | Lee et al. |
| 2010/0078684 A1* | 4/2010 | Rachmady et al. .......... 257/192 |
| 2010/0244018 A1* | 9/2010 | Kaneko ..................... 257/43 |
| 2011/0062438 A1* | 3/2011 | Kaneko ..................... 257/43 |
| 2011/0227089 A1 | 9/2011 | Mieczkowski et al. |
| 2011/0233538 A1* | 9/2011 | Iwakami et al. ............. 257/43 |
| 2011/0278590 A1 | 11/2011 | Mieczkowski et al. |
| 2013/0267085 A1 | 10/2013 | Hou et al. |

OTHER PUBLICATIONS

Non-Final Office Action for U.S. Appl. No. 13/852,346, mailed Apr. 7, 2016, 7 pages.
Final Office Action for U.S. Appl. No. 13/852,346, mailed Sep. 28, 2016, 9 pages.

\* cited by examiner

SEMICONDUCTOR DEVICE WITH REDUCED LEAKAGE CURRENT AND METHOD FOR MAKING THE SAME

RELATED APPLICATIONS

This application claims the benefit of U.S. provisional patent application No. 61/950,255, filed Mar. 10, 2014, the disclosure of which is incorporated herein by reference in its entirety.

FIELD OF THE DISCLOSURE

The present disclosure relates to fabricating semiconductor devices with reduced leakage current and, in particular, to fabricating metal structures such as rectifying contacts for semiconductor devices that have reduced leakage current.

BACKGROUND

Gallium Nitride (GaN) devices show great promise for next-generation high-power RF and high-voltage applications. However, for many applications, leakage currents are a significant concern. While many process, epitaxial, and design parameters can have an impact on the magnitude of leakage current, a gate metal stack typically used with GaN devices plays a critical role in the management of leakage current. A gold (Au) layer disposed on the GaN gate surface has been found to be a significant factor in driving leakage. Thus, the gate stack, which usually contains Au for RF devices, will need an effective diffusion barrier to prevent the Au from reaching the surface. Therefore, a need remains for a semiconductor device with reduced leakage current and a method for making the same.

SUMMARY

A semiconductor device with reduced leakage current and a method of making the same is disclosed. The semiconductor device includes a substrate having a device layer, a dielectric layer, and a gate metal opening within the dielectric layer between a source contact and a gate contact. A first metal layer is disposed within the gate metal opening, and a second metal layer is disposed directly onto the first metal layer, wherein the second metal layer is oxidized and has a thickness that ranges from about 4 Angstroms to about 20 Angstroms to limit a leakage current of a total gate periphery to between around 0.1 µA/mm and around 50 µA/mm. Alternatively, another range for leakage current of a total gate periphery is limited to between around 0.1 µA/mm and around 10 µA/mm. A current carrying layer is disposed on the second metal layer. In one embodiment, the first metal layer is nickel (Ni), the second metal layer is palladium (Pd), and the current carrying layer is gold (Au).

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
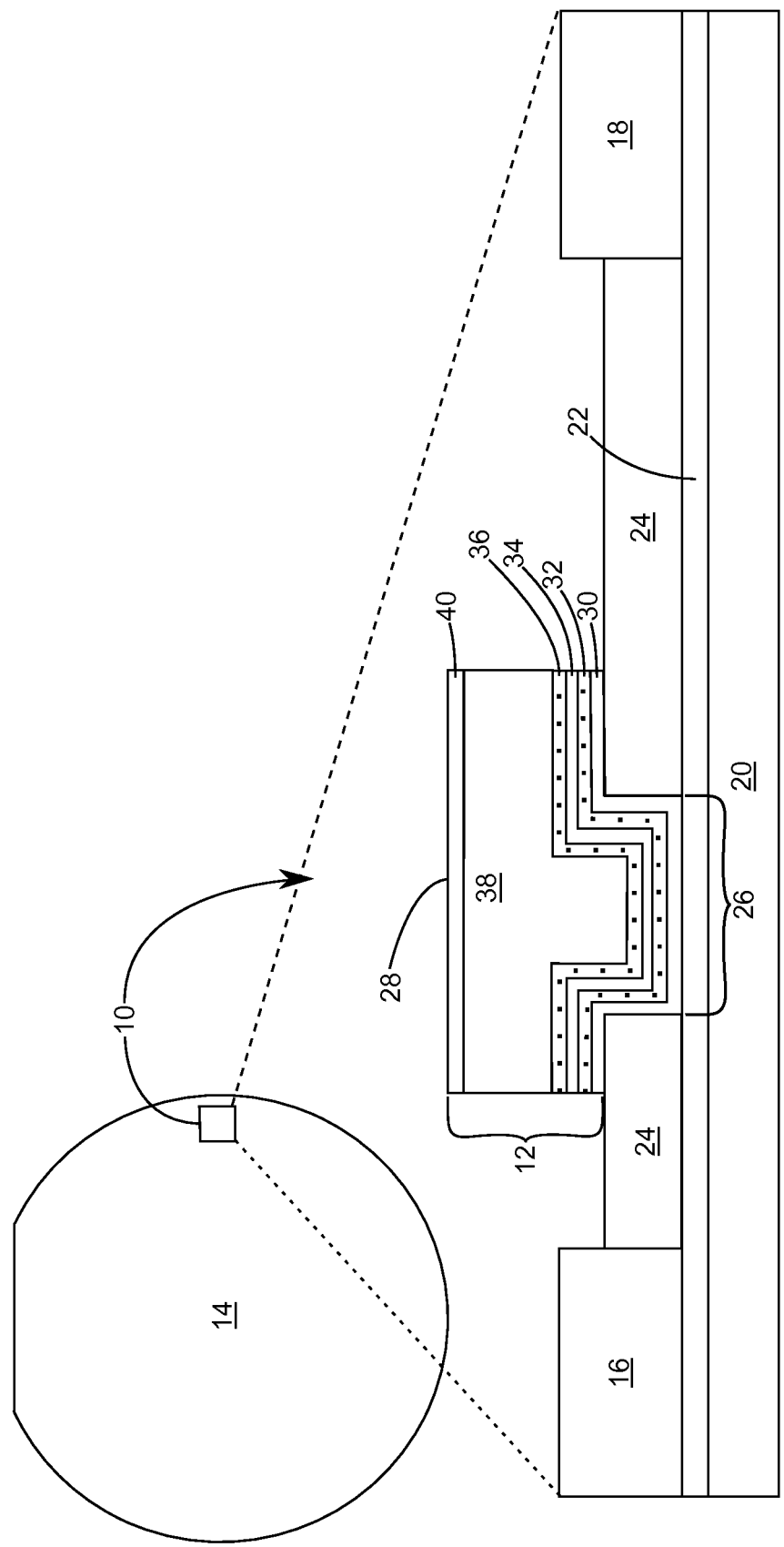
FIG. 1 is a cross-sectional diagram of a semiconductor device with an exemplary metal structure fabricated in accordance with methods of the present disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Physical analysis has shown that a portion of a gold (Au) layer can diffuse through voids or grain boundaries, or alternately around the edges and underneath barrier and Schottky layers. Au-free contacts have been found to be very effective at reducing leakage. However, the use of an Au-free contact is not an option for RF applications due to a significantly increased gate resistance (Rg) that results in degraded RF performance. For example, use of an Au-free contact in the gate stack will typically result in a greater than 4 dB loss in RF gain.

A traditional GaN gate stack comprises nickel, palladium, gold, and titanium (Ni/Pd/Au/Ti) layers, wherein the Pd layer is used as a barrier metal. However, that particular GaN gate stack has been shown to allow Au to easily diffuse/intermix and further diffuse through a Schottky layer. As a result, the Au problematically reaches the gate epitaxial surface, which increases leakage current after thermal processing or device operation at elevated temperatures. A platinum (Pt) layer acts as barrier when replacing the Pd layer in a Ni/Pt/Au/Ti gate structure, and has been shown to reduce/eliminate the Au diffusion/intermixing through the barrier. However, replacing the Pd layer with a Pt layer has a disadvantage of allowing Au to travel around the edges of the Pt barrier and under a Schottky layer. As a result, a portion of the Au reaches the gate epitaxial surface, thus substantially increasing leakage current. Alternately, Pd and Pt may be combined to create an Au diffusion barrier. As such, a gate stack with Ni/Pd—Pt—Pd/Au/Ti layers, using Pd—Pt—Pd as the Au diffusion barrier, has been shown to reduce gate leakage current by about two times. The following disclosure provides embodiments of a semiconductor device and methods for making the semiconductor device that reduce gate leakage current by an order of magnitude.

FIG. 1 is a cross-sectional diagram of an exemplary embodiment of a semiconductor device 10 having a metal structure 12 fabricated in accordance with methods of the present disclosure. The semiconductor device 10 is typically fabricated on a wafer 14. The semiconductor device 10 includes a source contact 16 and a drain contact 18. A substrate 20 carries a device layer 22 that in an exemplary case is GaN based, being made of aluminum gallium nitride (AlGaN) or GaN, or a combination thereof. A dielectric layer 24 is deposited over the device layer 22. Typically, the dielectric layer 24 is made of silicon nitride ($Si_3N_4$). A gate metal opening 26 for a gate 28 is etched in the dielectric layer 24. The metal structure 12 has metal layers that are typically transition metals such as, but not limited to, nickel (Ni), palladium (Pd), platinum (Pt), titanium (Ti), chromium (Cr), tantalum (Ta), and aluminum (Al). Transition metals are typically relatively easier to oxidize than other metals.

In the exemplary embodiment of the semiconductor device 10, the metal structure 12 includes a Ni layer 30, Pd layer 32 that is oxidized, a Pt layer 34, a second Pd layer 36, a gold (Au) layer 38 and a Ti layer 40. The second Pd layer 36 can optionally have oxidation. In this exemplary embodiment, the Pd layer 32 after oxidation has a thickness that ranges from about 4 Angstroms to about 20 Angstroms. The Ni layer 30, the Pt layer 34, the second Pd layer 36 and the Ti layer 40 each have a thickness that ranges from about 50 Angstroms to about 1000 Angstroms. Alternatively, other thickness ranges for the Ni layer 30, the Pt layer 34, the second Pd layer 36 and the Ti layer 40 can be 50 Angstroms to about 500 Angstroms, and 500 Angstroms to about 1000 Angstroms. However, in an optional case in which the second palladium layer is oxidized, the thickness of the second Pd layer 36 remains within the about 4 Angstroms to about 20 Angstroms range. The Au layer 38 is a relatively thicker layer that ranges between around 1000 Angstroms to around 8000 Angstroms thick. Alternatively, other thickness ranges for the Au layer 38 can be 1000 Angstroms to about 4000 Angstroms, and 4000 Angstroms to about 8000 Angstroms.

Figure 2:
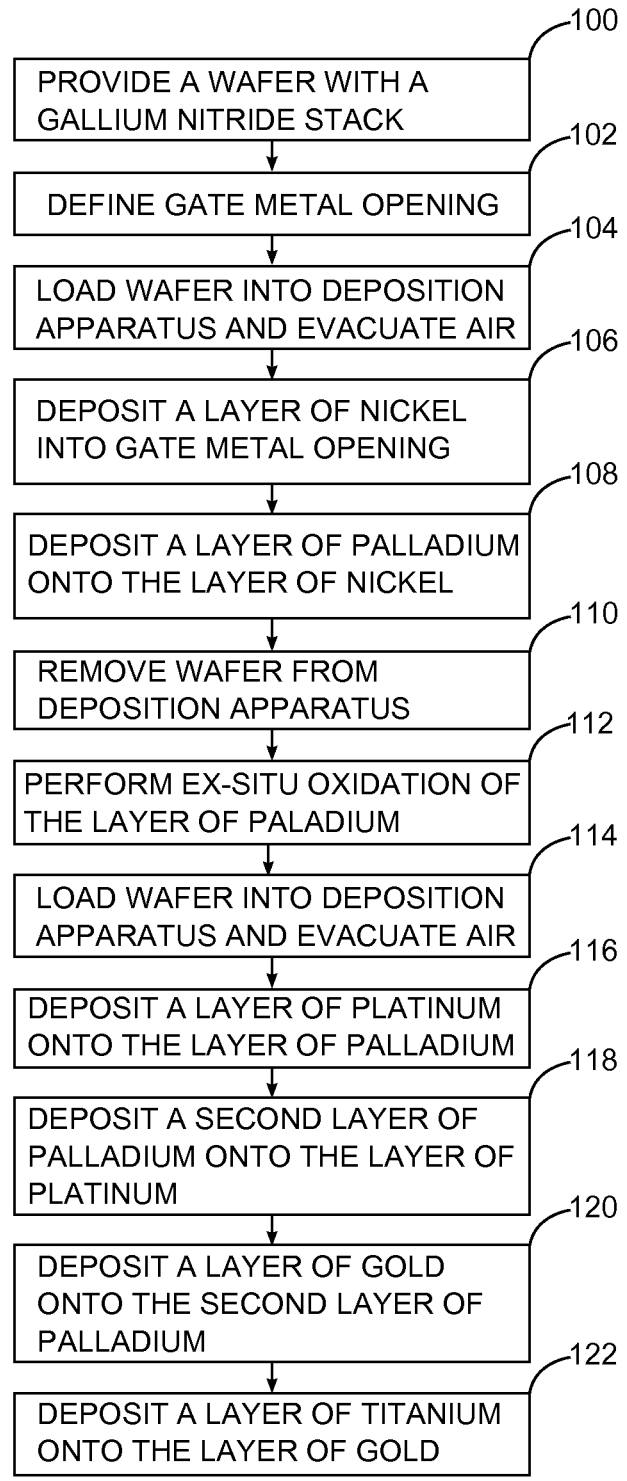
FIG. 2 is a process diagram for one embodiment of a method for fabricating the exemplary metal structure for the semiconductor device of FIG. 1.

FIG. 2 is a process diagram for one embodiment of a method for fabricating the exemplary metal structure for the semiconductor device 10 of FIG. 1. The method begins by providing the wafer 14 with the source contact 16 and the drain contact 18 preformed (step 100). A next step is defining a predetermined metal region such as the gate metal opening 26 (step 102). A photolithographic technique is typically used for defining the gate metal opening 26. The process continues by loading the wafer 14 into a deposition apparatus, including evacuating practically all gas from the deposition apparatus (step 104). The typical deposition apparatus used in the disclosed process includes a vacuum chamber that can be evacuated using a single pump down operation. Examples of suitable deposition apparatuses include but are not limited to thermal evaporators, electron beam (e-beam) evaporators or sputter equipment that uses continuous deposition. A next step includes depositing a layer of metal such as Ni layer 30 in the predefined metal region, which in this exemplary case is the gate metal opening 26 (step 106). A following step is depositing the Pd layer 32 onto the Ni layer 30 (step 108). Another step involves removing the wafer 14 from the deposition apparatus, which includes breaking the vacuum of the deposition apparatus (step 110). A following step comprises performing an ex-situ oxidation of the Pd layer 32 (step 112). In one embodiment, the ex-situ oxidation is accomplished by exposing the Pd layer 32 to oxygen plasma via an oxygen plasma device. In another embodiment, the oxidation is accomplished by exposing the Pd layer 32 to ambient air at room temperature for a predetermined amount of time that ranges from about 5 minutes to around 123 hours. Alternatively, the oxidation can be accomplished by exposing the Pd layer 32 to air at an elevated temperature that is above ambient temperature for the predetermined time.

After the Pd layer 32 has been oxidized ex-situ, the process continues with loading the wafer 14 back into the deposition apparatus and reestablishing a vacuum (step 114). Once the vacuum is reestablished, the process continues by depositing the Pt layer 34 onto the Pd layer 32 (step 116). Another step is depositing the second Pd layer 36 onto the Pt layer 34 (step 118). A next step is completed by depositing a current carrying layer, which in this case is the Au layer 38 (step 120). A remaining step is depositing the Ti layer 40 onto the Au layer 38 (step 122).

Figure 3:
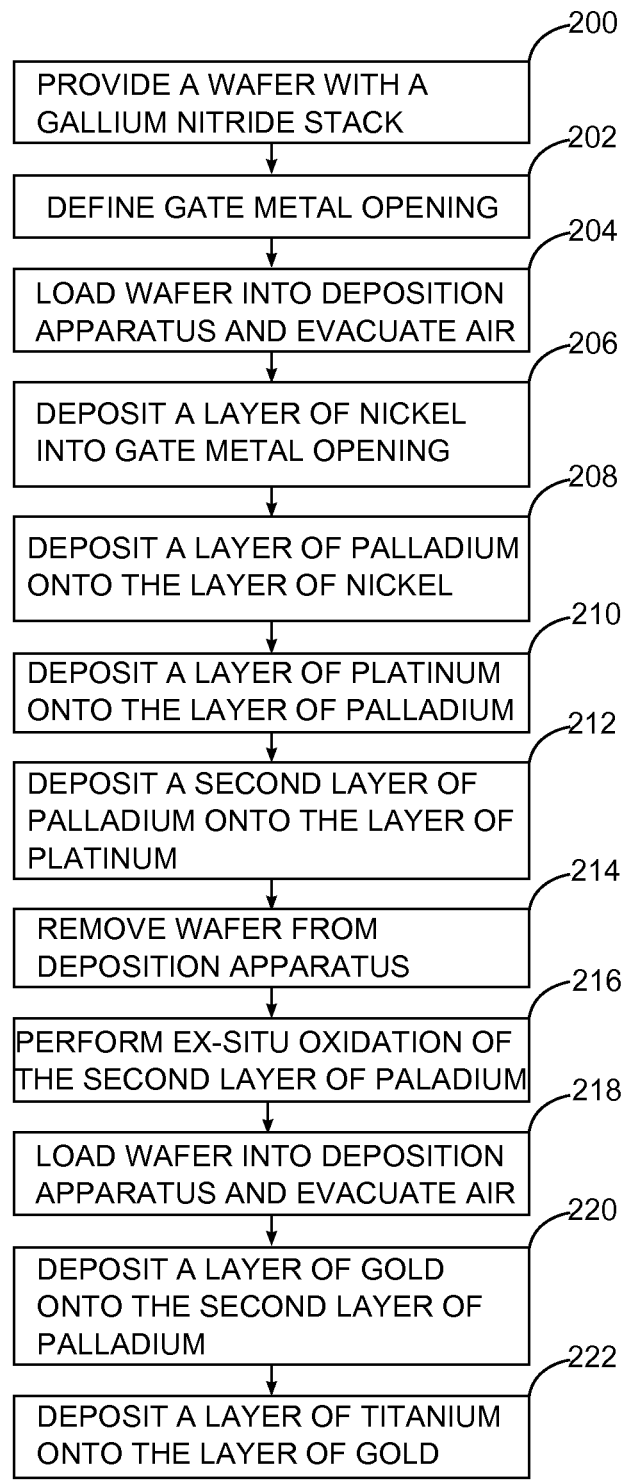
FIG. 3 is a process diagram for another embodiment of a method for fabricating the exemplary metal structure for the semiconductor device of FIG. 1.

FIG. 3 is a process diagram for another embodiment of a method for fabricating the exemplary metal structure for the semiconductor device 10 of FIG. 1. The method begins by providing the wafer 14 with the source contact 16 and the drain contact 18 preformed (step 200). A next step is defining a predetermined metal region such as the gate metal opening 26 (step 202). The process continues by loading the wafer 14 into a deposition apparatus, including evacuating practically all gas from the deposition apparatus (step 204). A next step comprises depositing a layer of metal such as Ni layer 30 in the predefined metal region, which in this exemplary case is the gate metal opening 26 (step 206). A following step is depositing the Pd layer 32 onto the Ni layer 30 (step 208). A further step is depositing the Pt layer 34 onto the layer of Pd 32 (step 210). A next step is depositing the second layer of Pd 36 onto the layer of Pt (step 212). Another step involves removing the wafer 14 from the deposition apparatus, which includes breaking the vacuum of the deposition apparatus (step 214). A following step comprises performing an ex-situ oxidation of the second Pd layer 36 (step 216). Similar to the method disclosed by FIG. 2, the oxidation of the second Pd layer 36 is accomplished by exposing the wafer 14 to oxygen plasma via an oxygen plasma device. In another embodiment, the oxidation is accomplished by exposing the Pd layer 32 to ambient air at room temperature for a predetermined amount of time that ranges from about 5 minutes to around 123 hours. Alternatively, and similar to the method disclosed by FIG. 2, the oxidation can be accomplished by exposing the wafer 14 to air at an elevated temperature that is above ambient temperature.

The process continues with loading the wafer 14 into the deposition apparatus and reestablishing a vacuum (step 218). Once the vacuum is reestablished, the process continues by depositing a current carrying layer, which is Au layer 38 in the case of exemplary semiconductor device 10 (step 220). A remaining step is depositing the Ti layer 40 onto the Au layer 38 (step 222)

Either of the methods disclosed in the process diagrams of FIGS. 2 and 3 results in monolayers of non-crystalline oxides that are formed on the surface of the Pd layer 32 or the second Pd layer 36. As such, the presently disclosed ex-situ methods reduce gate leakage current by at least two hundred times over a transition metal/noble metal deposition used by typical metal structure fabrication processes. By oxidizing the Pd layer 32 with oxygen plasma, a relatively large gate leakage current of around 500 µA/mm for a total gate periphery is reduced to around 0.1 µA/mm. Alternatively, a range for leakage current of a total gate periphery is limited to between around 0.1 µA/mm and around 50 µA/mm. Another range for leakage current of a total gate periphery is limited to between around 0.1 µA/mm and around 10 µA/mm. Yet another range for leakage current of a total gate periphery is limited to between around 10 µA/mm and around 50 µA/mm. It is to be understood that the methods disclosed in the process diagrams of FIGS. 2 and 3 can be combined to oxidize both the Pd layer 32 and the second Pd layer 36 within the metal stack 12 to realize an embodiment of the semiconductor 10 that reduces gate leakage current even further at the expense of increased manufacturing time and steps.

Those skilled in the art will recognize improvements and modifications to the embodiments of the present disclosure. All such improvements and modifications are considered within the scope of the concepts disclosed herein and the claims that follow.

What is claimed is:

1. A semiconductor device with reduced leakage current comprising:
    a substrate having a device layer, a dielectric layer, and a gate metal opening within the dielectric layer between a source contact and a gate contact;
    a first metal layer disposed within the gate metal opening;
    a second metal layer disposed directly onto the first metal layer, wherein the second metal layer is oxidized and has a thickness that ranges from 4 Angstroms to 20 Angstroms; and
    a current carrying metal layer disposed over the second metal layer.

2. The semiconductor device of claim 1 wherein the first metal layer is nickel (Ni).

3. The semiconductor device of claim 1 wherein the second metal layer is palladium (Pd).

4. The semiconductor device of claim 1 wherein the current carrying metal layer is gold (Au).

5. The semiconductor device of claim 1 further including a titanium (Ti) layer disposed directly onto the current carrying metal layer.

6. The semiconductor device of claim 1 further including a platinum (Pt) layer disposed directly onto the second metal layer.

7. The semiconductor device of claim 6 further including a second Pd layer disposed directly onto the Pt layer.

8. The semiconductor device of claim 7 wherein the second Pd layer is oxidized and has a thickness that ranges from 4 Angstroms to 20.

9. The semiconductor device of claim 1 wherein the leakage current is limited to within a range of between 0.1 µA/mm and 10 µA/mm.

10. The semiconductor device of claim 1 wherein the device layer is a gallium nitride (GaN) based layer.

11. A method for making a semiconductor device comprising:
    providing a wafer with a substrate having a device layer, a dielectric layer, and a gate metal opening within the dielectric layer between a source contact and a gate contact;
    loading the wafer into a deposition apparatus;
    evacuating the deposition apparatus of air;
    disposing a first metal layer within the gate metal opening;
    disposing a second metal layer directly onto the first metal layer to a thickness that ranges from 4 Angstroms to 20 Angstroms;
    removing the wafer from the deposition apparatus;
    oxidizing the second metal layer ex-situ;
    loading the wafer into the deposition apparatus;
    evacuating the deposition apparatus of air; and
    disposing a current carrying metal layer on the second metal layer.

12. The method of making a semiconductor device of claim 11 wherein the first metal layer is Ni.

13. The method of making a semiconductor device of claim 11 wherein the second metal layer is Pd.

14. The method of making a semiconductor device of claim 11 wherein the current carrying metal layer is Au.

15. The method of making a semiconductor device of claim 11 wherein oxidizing the second metal layer is performed by exposing the second metal layer to air for a predetermined time.

16. The method of making a semiconductor device of claim 11 wherein oxidizing the second metal layer is performed by exposing the second metal layer to an oxygen plasma using an oxygen plasma device.

17. The method of making a semiconductor device of claim 11 further including disposing a Pt layer directly onto the second metal layer before disposing the current carrying metal layer.

18. The method of making a semiconductor device of claim 17 further including disposing a second Pd layer having a thickness that ranges from 4 Angstroms to 20 Angstroms before disposing the current carrying metal layer.

19. The method of making a semiconductor device of claim 18 further including removing the wafer from the deposition apparatus and oxidizing the second Pd layer to limit the leakage current to within a range of between 0.1 µA/mm and 10 µA/mm.

20. The method of making a semiconductor device of claim 11 further including placing the wafer into the a/the deposition apparatus, evacuating air from within the deposition apparatus and disposing a Ti layer directly onto the current carrying metal layer.

21. The method of making a semiconductor device of claim 11 wherein the device layer is a gallium nitride (GaN) based layer.

* * * * *